(12) United States Patent
Hsu

(10) Patent No.: US 11,754,928 B2
(45) Date of Patent: Sep. 12, 2023

(54) LITHOGRAPHY EXPOSURE METHOD WITH DEBRIS REMOVING MECHANISM

(71) Applicant: TAIWAN SEMICONDUCTOR MANUFACTURING CO., LTD., Hsinchu (TW)

(72) Inventor: Hung-Jung Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 507 days.

(21) Appl. No.: 16/810,020

(22) Filed: Mar. 5, 2020

(65) Prior Publication Data
US 2021/0063890 A1    Mar. 4, 2021

Related U.S. Application Data

(60) Provisional application No. 62/893,593, filed on Aug. 29, 2019.

(51) Int. Cl.
*G03F 7/20* (2006.01)
*G03F 7/00* (2006.01)
*H01L 21/027* (2006.01)
*G02B 5/08* (2006.01)

(52) U.S. Cl.
CPC ....... *G03F 7/70033* (2013.01); *G02B 5/0808* (2013.01); *G03F 7/2063* (2013.01); *G03F 7/70716* (2013.01); *G03F 7/70916* (2013.01); *H01L 21/0275* (2013.01)

(58) Field of Classification Search
CPC .. G03F 7/2063; G03F 7/2008; G03F 7/70033; G03F 7/70916
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2015/0192861 A1* | 7/2015 | Banine | G03F 7/70191 355/71 |

OTHER PUBLICATIONS

Patrick Campbell et al., "Light trapping properties of pyramidally textured surfaces", Journal of Applied Physics 62, pp. 243-249 (1987).

* cited by examiner

*Primary Examiner* — Daborah Chacko-Davis
(74) *Attorney, Agent, or Firm* — Maschoff Brennan

(57) ABSTRACT

A method for a lithography exposing process includes placing a reticle over a reticle stage, generating a light beam by irradiating a droplet by a laser, projecting a first portion of the light beam over a plurality of light permeable protrusions formed on a reflection layer and directing, by the protrusions and the reflection layer, the first portion of the light beam to the reticle.

20 Claims, 9 Drawing Sheets

LITHOGRAPHY EXPOSURE METHOD WITH DEBRIS REMOVING MECHANISM

PRIORITY CLAIM AND CROSS-REFERENCE

This application claims the benefit of U.S. Provisional Application No. 62/893,593, filed on Aug. 29, 2019, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposure process forms a patterned photoresist layer for various patterning processes, such as etching or ion implantation. In a typical lithography process, a photosensitive layer (resist) is applied to a surface of a semiconductor substrate, and an image of features defining parts of the semiconductor device is provided on the layer by exposing the layer to a pattern of high-brightness light. As semiconductor processes evolve to provide for smaller critical dimensions, and devices become smaller and increase in complexity, including the number of layers, a way of accurately patterning the features is needed in order to improve the quality, reliability, and yield of the devices.

Although numerous improvements to the methods of performing a lithography exposure process have been invented, they have not been entirely satisfactory in all respects. Consequently, it would be desirable to provide a solution to improve the lithographic system so as to increase the production yield of the semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
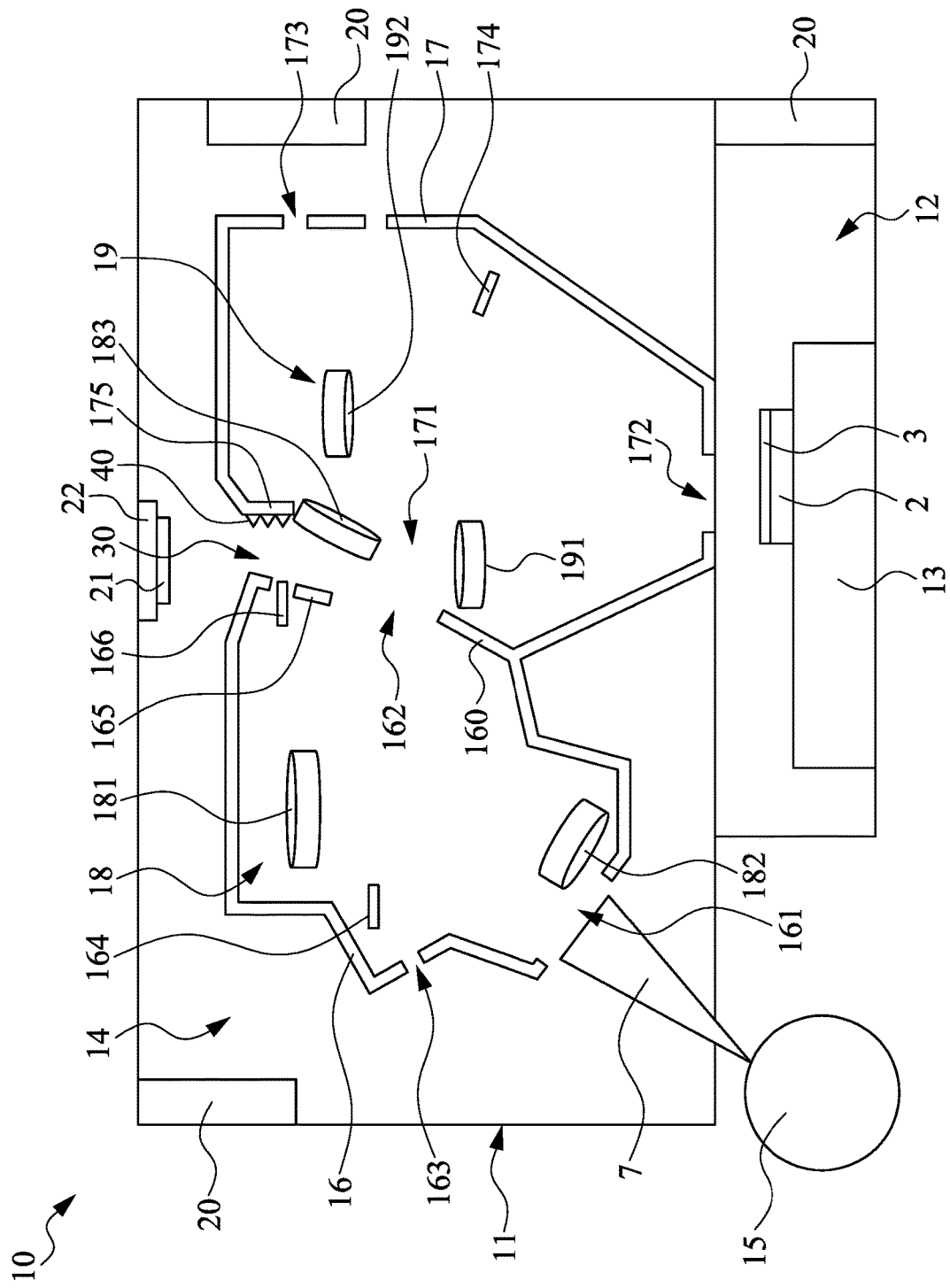
FIG. 1 is a schematic view of a lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the below disclosure.

FIG. 1 is a schematic and diagrammatic view of a lithography system 10, in accordance with some embodiments. The lithography system 10 is configured to use a light beam 7 to expose a photoresist layer 3 coated on a wafer 2. In some embodiments, the lithography system 10 includes a number of vacuum vessels, such as first vacuum vessel 11 and second vacuum vessel 12, a wafer stage 13, and an exposure tool 14. The elements of the lithography system 10 can be added to or omitted, and the invention should not be limited by the embodiment.

The first vacuum vessel 11 and the second vacuum vessel 12 preserve respective vacuum environments at ultra-high vacuum pressures. The vacuum pressure in the first vacuum vessel 11 may be lower than the second vacuum vessel 12. For example, the vacuum pressure in the first vacuum vessel 11 may be about 1.5*10−2 mB to about 2.8*10−2 mB, and the vacuum pressure in the second vacuum vessel 12 may be about 8*10−2 mB.

The wafer stage 13 is configured for supporting the wafer 2 during the lithography exposing process. In some embodiments, the wafer stage 13 is positioned in the second vacuum vessel 12 and moveable between a leveling position and an exposure position in the second vacuum vessel 12 by a driving member, such as linear motor (not shown in figures). A radial and rotational movement of the wafer stage 13 can be coordinated or combined in order to transfer, and deliver the wafer 2.

The exposure tool 14 is configured to apply a high-brightness light beam including a pattern in the beam's cross-section onto the surface of the wafer 2 so as to print desired patterns over the photoresist layer 3 coated on the wafer 2. In some embodiments, the exposure tool 14 includes a light source 15, a first inner chamber 16, a second inner chamber 17, an illuminator 18, a projection optics module (or projection optics box (POB)) 19, a number of pumping modules 20, a reticle 21, a reticle stage 22 and a particle blocker 40.

Figure 2:
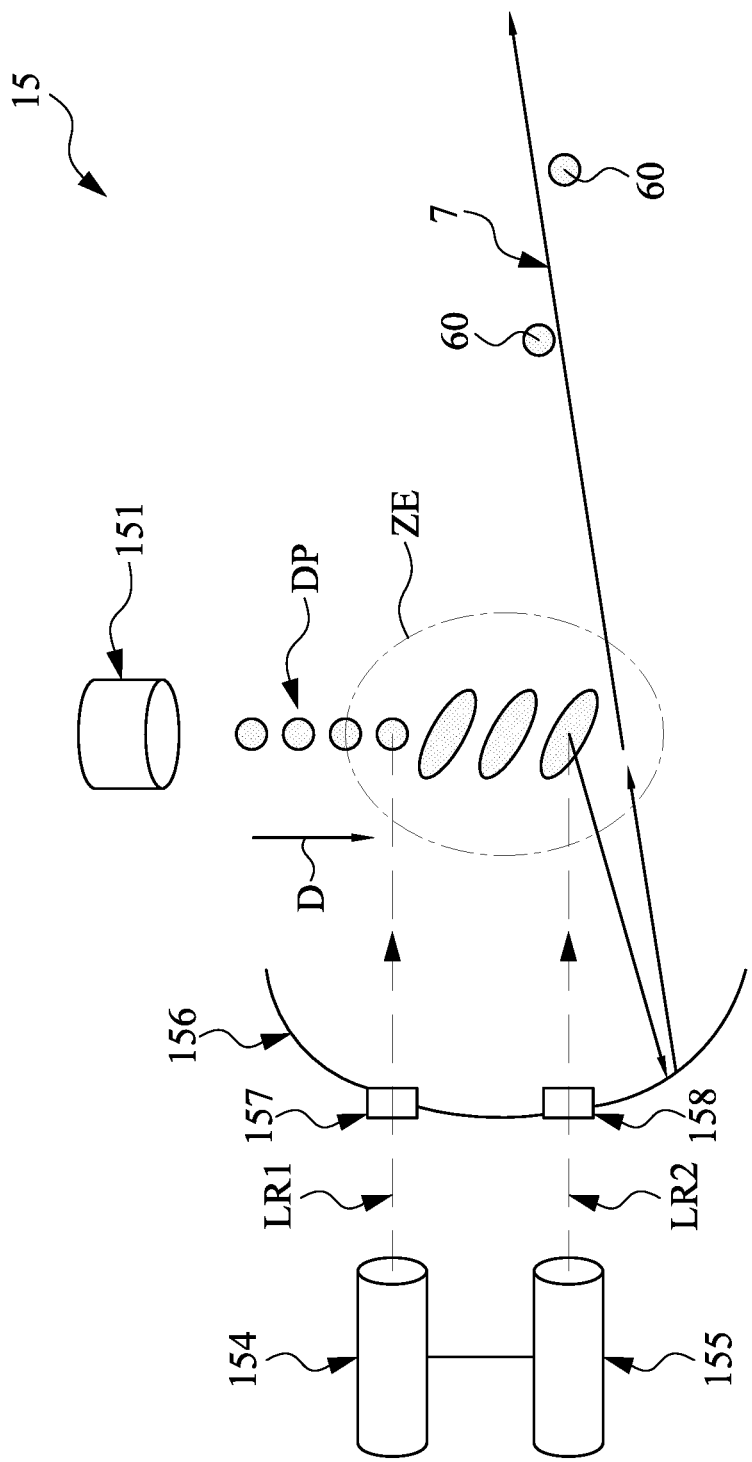
FIG. 2 is a schematic view of a light source according to some embodiments of the present disclosure.

FIG. 2 is a schematic view of the light source 15 according to some embodiments of the present disclosure. The light source 15 employs a laser produced plasma (LPP) mechanism to generate plasma and further generate EUV light from the plasma. EUV light employs radiation having a wavelength of about 1-100 nm, e.g., 13.5 nm. In the following description, the light source 15 is also referred to as EUV light source.

In some embodiments, the EUV light source 15 includes a fuel target generator 151, a first laser source 154, a second laser source 155, and a collector 156. The fuel target generator 151 generates droplets DP along a direction D. In some embodiments, the droplets DP are metal droplets, such as droplets of tin (Sn), lithium (Li), or an alloy of Sn and Li. In some embodiments, the droplets DP each have a diameter in a range from about 10 microns ($\mu m$) to about 100 $\mu m$. For example, in an embodiment, the droplets DP are tin droplets, having a diameter of about 10 $\mu m$ to about 100 $\mu m$. In other embodiments, the droplets DP are tin droplets having a diameter of about 25 $\mu m$ to about 50 $\mu m$. In some embodiments, the droplets DP are supplied through the fuel target generator 151 at a rate in a range from about 50 droplets per second (i.e., an ejection-frequency of about 50 Hz) to about 50,000 droplets per second (i.e., an ejection-frequency of about 50 kHz). In some embodiments, the droplets DP are supplied at an ejection-frequency of about 100 Hz to about 25 kHz. In other embodiments, the droplets DP are supplied at an ejection frequency of about 500 Hz to about 10 kHz. The droplets DP are ejected through the fuel target generator 151 and into a zone of excitation ZE at a speed in a range of about 10 meters per second (m/s) to about 100 m/s in some embodiments. In some embodiments, the droplets DP have a speed of about 10 m/s to about 75 m/s. In other embodiments, the droplets DP have a speed of about 25 m/s to about 50 m/s.

The first laser source 154 is configured to produce a pre-pulse laser LR1. The second laser source 155 is configured to produce a main pulse laser LR2. In an embodiment, the first laser source 154 is a carbon dioxide ($CO_2$) laser source. In another embodiment, the first laser source 154 is a neodymium-doped yttrium aluminum garnet (Nd:YAG) laser source. In an embodiment, the second laser source 155 is a $CO_2$ laser source.

In some embodiments, the pre-pulse laser LR1 have a spot size about 100 $\mu m$ or less, and the main laser pulses have a spot size in a range of about 150 $\mu m$ to about 300 $\mu m$. In some embodiments, the pre-pulse laser LR1 and the main pulse laser LR2 have a pulse-duration in the range from about 10 ns to about 50 ns, and a pulse-frequency in the range from about 1 kHz to about 100 kHz. In some embodiments, the pre-pulse laser LR1 and the main pulse laser LR2 have an average power in the range from about 1 kilowatt (kW) to about 50 kW. The pulse-frequency of the excitation laser LB is matched with the ejection-frequency of the droplets DP in some embodiments.

The pre-pulse laser LR1 and the main pulse laser LR2 are directed through windows 157 and 158 in the collector 156 into the zone of excitation ZE. The windows 157 and 158 are made of a suitable material substantially transparent to the pre-pulse laser LR1 and the main pulse laser LR2. The generation of the pulse lasers is synchronized with the ejection of the droplets DP. As the droplets DP move through the excitation zone ZE, the pre-pulse laser LR1 hits the droplets DP and transforms them into low-density target plumes. A delay between the pre-pulse laser LR1 and the main pulse laser LR2 is controlled to allow the target plume to form and to expand to an optimal size and geometry. In some embodiments, the pre-pulse laser LR1 and the main pulse laser LR2 have the same pulse-duration and peak power. When the main pulse laser LR2 heats the target plume, a high-temperature plasma is generated. The plasma emits light beam 7, which is collected by the collector mirror 240. The collector 156 further reflects and focuses the light beam 7 for the lithography exposing processes.

In some embodiments, the collector 156 is designed with a proper coating material and shape to function as a mirror for EUV collection, reflection, and focusing. In some embodiments, the collector 156 is designed to have an ellipsoidal geometry. In some embodiments, the coating material of the collector 156 is similar to the reflective multilayer of the reticle 21 (as shown in FIG. 1). In some embodiments, the coating material of the collector 156 includes a ML (such as one or more Mo/Si film pairs) and may further include a capping layer (such as Ru) coated on the ML to substantially reflect the EUV light. In some embodiments, the collector 156 may further include a grating structure designed to effectively scatter the laser beam directed onto the collector 156. For example, a silicon nitride layer is coated on the collector 156 and is patterned to have a grating pattern. In some embodiments, as shown in FIG. 2, the high-temperature plasma may cool down and become vapors or small particles (collectively, debris) 60. The debris 60 may move out of the EUV light source 15 and contaminate optics, such as optics 181-183 (will be described below) or reticle 21, in the exposure tool 14.

Referring to FIG. 1, in some embodiments, the first inner chamber 16 and the second inner chamber 17 are positioned in the first vacuum vessel 11. The first inner chamber 16 includes a light entry passage 161, a light emitting passage 162, and one or more orifices 163. The light entry passage 161 faces the EUV light source 15. Light generated from the EUV light source 15 enters the first inner chamber 16 through the light entry passage 161. The light emitting passage 162 is located in the vicinity of the reticle stage 22 and allows light from the light entry passage 161 to leave the first inner chamber 16. The orifice 163 communicates the interior of the first inner chamber 16 to the first vacuum vessel 11 for exhausting gas inside the first inner chamber 16.

The second inner chamber 17 is positioned adjacent to the first inner chamber 16 and includes a light entry passage 171, a light emitting passage 172, and one or more orifices 173. The light entry passage 171 is located in the vicinity of the reticle stage 22. Light reflected by the reticle 21 held by the reticle stage 22 enters the second inner chamber 17 through the light entry passage 171. The light emitting passage 172 faces the wafer stage 13 and allows light from the light entry passage 171 to leave the second inner chamber 17. In some embodiments, the light emitting passage 162 directly faces the light entry passage 171, and a lower edge of the light emitting passage 162 and a lower edge of the light entry passage 171 are construed by the same side wall 160. The orifice 173 communicates the interior of the second inner chamber 17 to the first vacuum vessel 11 for exhausting gas inside the second inner chamber 17.

In some embodiments, the first inner chamber 16 includes a number of gas inlets, such as gas inlet 164 located in the first inner chamber 16. In addition, the second inner chamber 17 includes a number of gas inlets, such as gas inlet 174, located in the second inner chamber 17. The gas inlets 164 and 174 are configured for supplying purging gas, such as $H_2$, $N_2$ or XCDA, to facilitate the removal of debris 60 in the first inner chamber 16 or in the second inner chamber 17.

Figure 3:
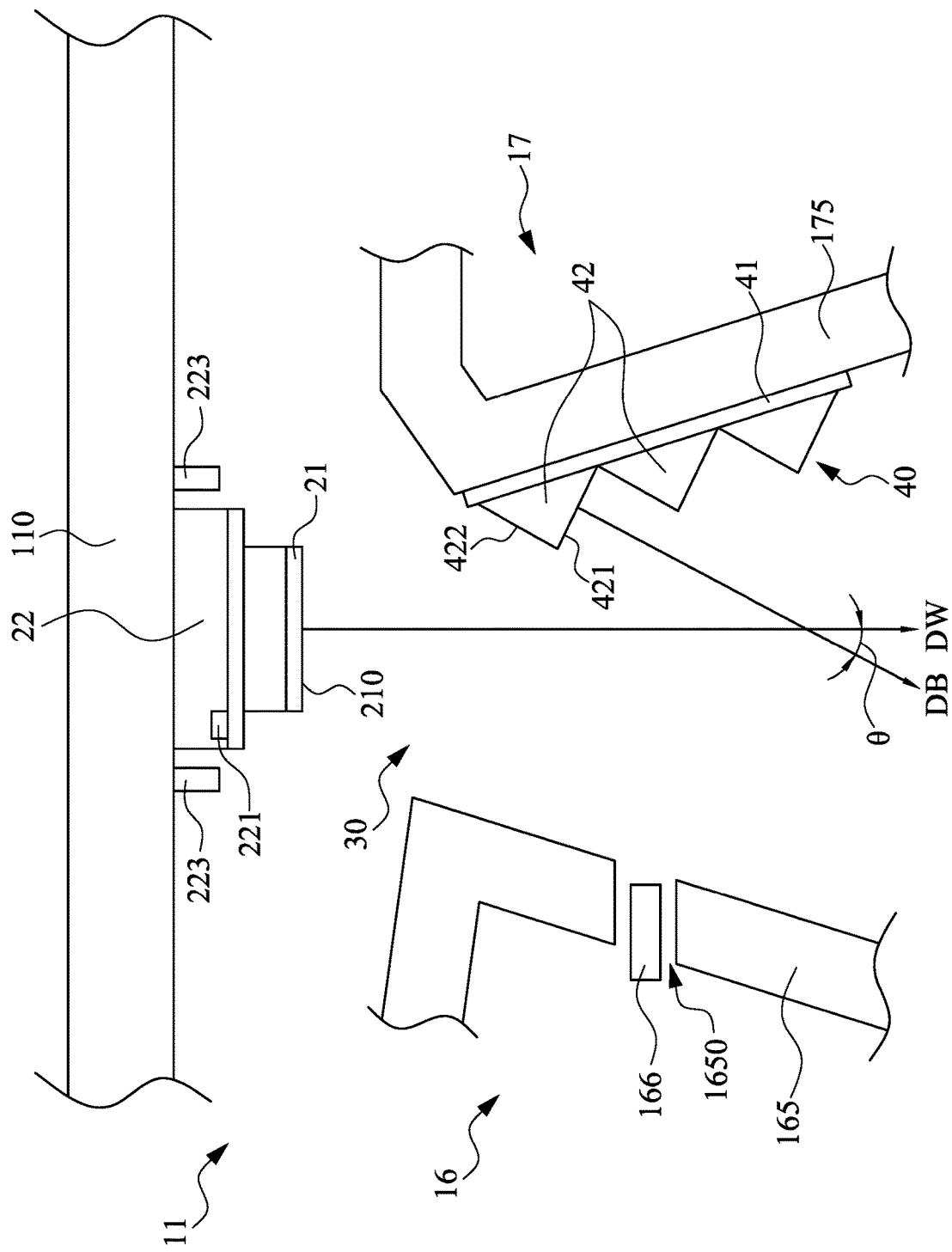
FIG. 3 is a partial view of a lithography system according to some embodiments of the present disclosure.

The illuminator 18 is configured for directing light from the EUV light source 15 to the reticle 21. In some embodiments, the illuminator 18 includes various optics 181, 182 and 183. The optics 181 and 182 (also referred to as a first group of optics) may be positioned in the first inner chamber 16, and the optic 183 may be positioned outside the first inner chamber 16 and located below the reticle 21, for example in an intermediate passage 30 (will be described in detail in the below description). The optics 181, 182 and 183 may be reflective optics, such as a single mirror or a mirror system having multiple mirrors in order to direct light from the EUV light source 15 onto the reticle stage 22, particularly to a reticle 21 (as shown in FIG. 3) secured on the reticle stage 22. In the present embodiment where the EUV light source 15 generates light in the EUV wavelength range, reflective optics is employed.

The projection optics module 19 is configured for imaging the pattern of the reticle 21 on to the wafer 2 secured on the wafer stage 13. In some embodiments, the projection optics module 19 includes various optics 191 and 192 (also referred to as a second group of optics) positioned in the second inner chamber 17. The optics 191 and 192 may be reflective optics in various embodiments. The light directed from the reticle 21, carrying the image of the pattern defined on the reticle, is collected by the projection optics module 19 and guided to the wafer 2.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

In some embodiments, the exposure tool 14 further includes a number of actuators (not shown in the figures) connected to the illuminator 18 and the projection optics module 19 to adjust the position of optics of the illuminator 18 and the projection optics module 19. The actuators are electrically connected to the controlling apparatus (not shown in figures). In addition, the actuator is controlled to drive the movement of the optic elements of the illuminator 18 and the projection optics module 19 according the signals issued by the controlling apparatus. As a result, the focal length of the high-brightness light scanned over the wafer 2 can be adjusted.

The pumping modules 20 are configured to create a vacuum in the first vacuum vessel 11 and the second vacuum vessel 12. The pumping module 20 may include a number of vacuum pumps with different ultimate pressure connected in series so as to improve the pumping speed of the first vacuum vessel 11 and the second vacuum vessel 12.

For example, the pumping module 20 includes a primary pump connected in series to a secondary pump. The primary pump is used to lower pressure from one pressure state (typically atmospheric pressure) to a lower pressure state, and after which the secondary pump is used to evacuate the process chamber down to high-vacuum levels needed for processing. The primary pump may be a skimmer pump, a diaphragm pump, a rotary vane pump, or a scroll pump. The secondary pump may be a high-vacuum molecular pump, or a rotary pump. The gas exhausted from the pumping module 20 may be discharged into a gas handling system (not shown) of a FAB through a gas conduit (not shown in figure).

FIG. 3 is a partial view of a lithography system according to some embodiments of the present disclosure. In some embodiments, the reticle stage 22 is configured to support the reticle 21 and control the movement of the reticle 21. In some embodiments, the reticle stage 22 is positioned on a top panel 110 of the first vacuum vessel 11. When the reticle 21 is held by the reticle stage 22, the reticle 21 faces in a downward direction DW. In some embodiments, the reticle stage 22 includes one or more actuators 221 and guiding members to drive a movement of the reticle 21 in one or multiple directions that are perpendicular to the downward direction DW. In some embodiments, one or more than one gas nozzles 223 are arranged adjacent to the reticle stage 22. The gas nozzles 223 are configured for supplying purging gas, such as $H_2$, $N_2$ or XCDA, along a direction that is parallel to the downward direction DW to avoid existing particles on the reticle 21.

In the present disclosure, the terms mask, photomask, and reticle are used interchangeably. In the present embodiment, the reticle 21 is a reflective reticle. One exemplary structure of the reticle 21 includes a substrate with a suitable material, such as a low thermal expansion material or fused quartz. In various examples, the material includes $TiO_2$ doped $SiO_2$, or other suitable materials with low thermal expansion. The reticle 21 includes multiple reflective multiple layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The reticle 21 may further include a capping layer, such as ruthenium (Ru), disposed on the ML for protection. The reticle 21 further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift reticle.

In some embodiments, an intermediate passage 30 is located below the reticle stage 22. The intermediate passage 30 is positioned on a light traveling path along which the light from the light emitting passage 162 (as shown in FIG. 1) is transmitted to the reticle stage 22. In some embodiments, the intermediate passage 30 is located between a wall 165 of the first inner chamber 16 and a wall 175 of the second inner chamber 17. The wall 165 connects to an upper edge of the light emitting passage 162 (as shown in FIG. 1), and the wall 175 connects to an upper edge of the light entry passage 171 (as shown in FIG. 1). The wall 165 and the wall 175 may outwardly and downwardly extend. As a result, a width of the intermediate passage 30 gradually increases in direction away from the reticle stage 22. However, it will be appreciated that many variations and modifications can be made to the intermediate passage 30 of the disclosure.

In some embodiments, a mounting hole 1650 is formed on one of the wall that defines the intermediate passage 30. For example, the mounting hole 1650 is formed on the wall 165 of the first inner chamber 16. A gas nozzle 166 is positioned in the mounting hole 1650 to provide purging gas into the intermediate passage 30. The gas nozzle 166 is configured for supplying purging gas, such as $H_2$, $N_2$ or XCDA, into the intermediate passage 30 to facilitate the removal of particles in the intermediate passage 30.

The particle blocker 40 is configured to block debris from dropping on the reticle 21. In some embodiments, the particle blocker 40 is positioned in a vicinity of an optic, which is the last optical component used to change the light transmission direction before the light reaches the reticle 21 (or the reticle stage 22). In the present embodiment, the optics 183 is the optical component which determines a final incidence angle of a portion of light beam incident on the reticle 21, and the particle blocker 40 is positioned in a vicinity of the optics 183, as shown in FIG. 1.

In accordance with some embodiments, the particle blocker 40 includes a reflection layer 41. The reflection layer 41 may be detachably mounted on the wall 175 of the second inner chamber 17 via an adhesive material. Alternatively, the reflection layer 41 may have a unitary construction with the second inner chamber 17, i.e., the reflection layer 41 and the wall 175 being integral with each other. In some embodiments, the reflection layer 41 includes a proper coating material and shape to function as a mirror for EUV reflection. In some embodiments, the coating material of the reflection layer 41 is similar to the reflective multilayer of the reticle. In some examples, the coating material of the reflection layer 41 includes multiple layers (such as a plurality of Mo/Si film pairs) and may further include a capping layer (such as Ru) coated on the multiple layers to substantially reflect the EUV light.

Figure 4:
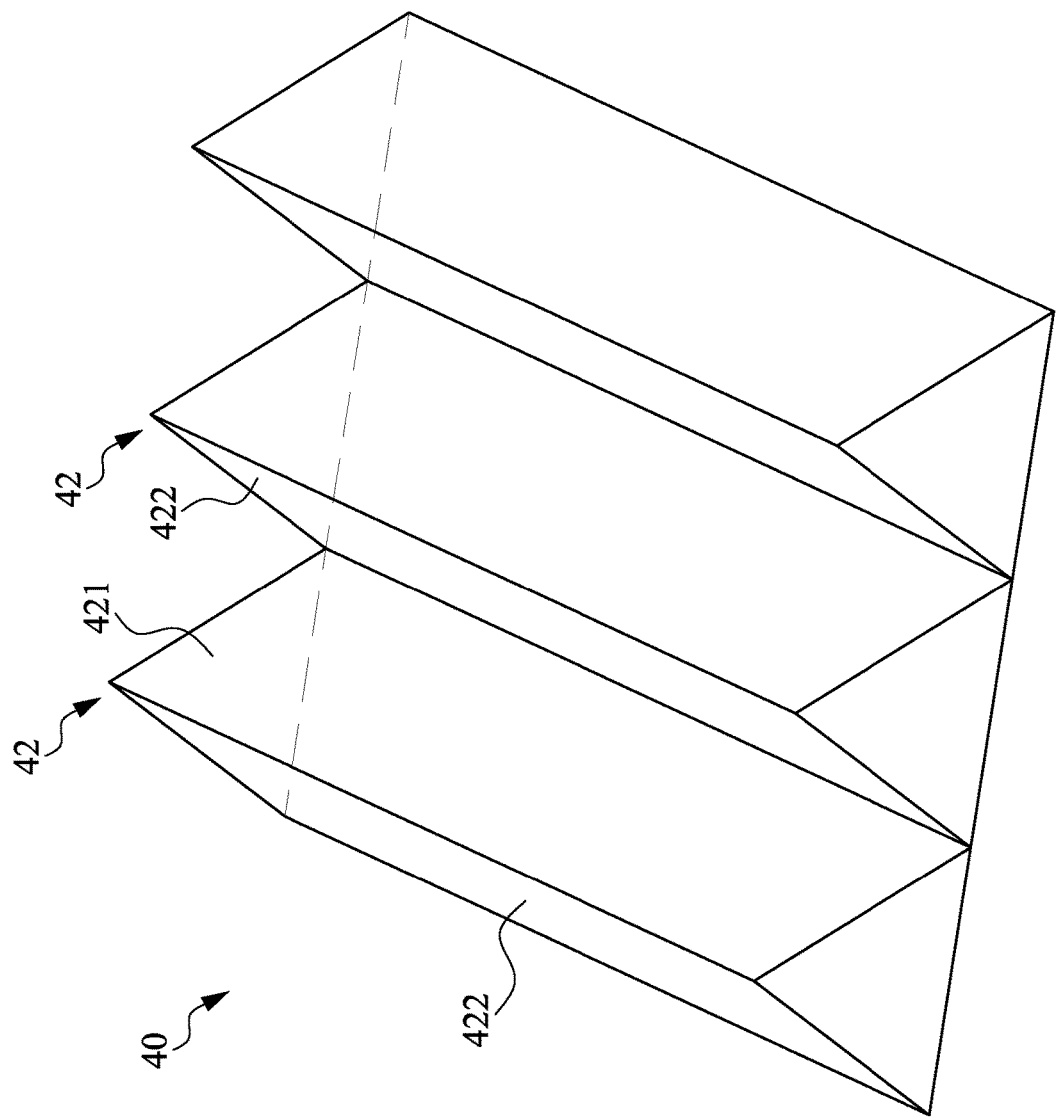
FIG. 4 is a schematic view of protrusions of a particle blocker according to some embodiments of the present disclosure.
Figure 5:
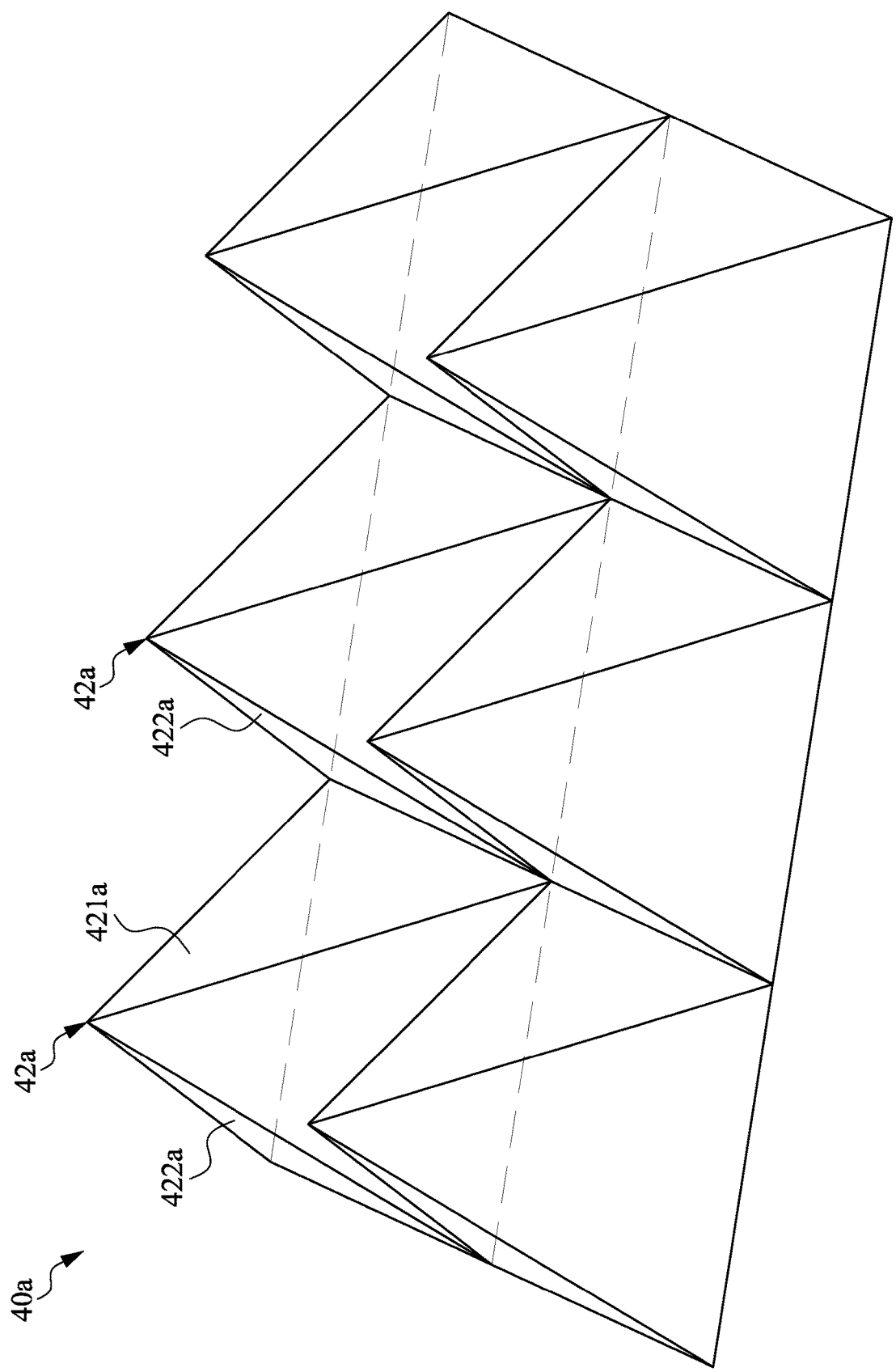
FIG. 5 is a schematic view of protrusions of a particle blocker according to some embodiments of the present disclosure.

In some embodiments, the particle blocker 40 further includes a number of light permeable protrusions 42 formed from a material different than the coating material of the reflection layer 41. The protrusions 42 are made of light permeable material such as $SiO_2$, rather than Mo/Si film pairs. In this way, the light can pass through the light permeable protrusions 42 to the reflection layer 41, and then be reflected by the reflection layer 41. In some embodiments, the protrusions 42 are formed over the reflection layer 41 by using etching, nanoimprint lithography or any other suitable pattern formation techniques. The protrusions 42 may include a number of strips having a triangular cross-section, as shown in FIG. 4. The strips may be arranged side by side with an extension direction of each strip being perpendicular to a direction that is away from the optic 183 (as shown in FIG. 1). Alternatively, as shown in FIG. 5, protrusions 42a of a particle blocker 40a of another embodiment are rectangular pyramids. The pyramidal protrusions may be arranged in a simple matrix.

In some embodiments, two of the neighboring protrusions are arranged immediately adjacent to one the other, i.e., no gap is formed between the bottom lateral edges of the two neighboring protrusions. In addition, the entire surface of the reflection layer 41 is covered by the protrusions 42. As a result, the light beam projected on the particle blocker 40 firstly passes through the protrusions 42 and then impinges on the reflection layer 41. Moreover, the light beam reflected by the reflection layer 41 passes through the protrusions 42 firstly and then leaves the particle blocker 40.

In some embodiments, each of the protrusions 42 includes a bouncing surface and a rear surface for allowing light to enter and leave the protrusions 42. For example, as shown in FIG. 4, each of the protrusions 42 has a bouncing surface 421 and a rear surface 422. The bouncing surface 421 and the rear surface 422 are two lateral sides of each of the triangular strips, and two neighboring protrusions 42 have their bouncing surface 421 and rear surface 422 facing each other. Alternatively, as shown in FIG. 5, each of the protrusions 42a includes a bouncing surface 421a and a rear surface 422a. The bouncing surface 421a and a rear surface 422a are two opposite sides of each of the rectangular pyramids, and two neighboring protrusions 42a have their bouncing surface 421a and rear surface 422a facing each other.

Referring to FIG. 3, the bouncing surface 421 is arranged such that light from the EUV light source 15 is incident into each of protrusions 42 through the corresponding bouncing surface 421. In some embodiments, the bouncing surface 421 of each of the protrusions 42 faces in a direction DB that forms an acute angle $\ominus$ with the downward direction DW (i.e., a normal direction of a front surface of the reticle stage). The acute angle $\ominus$ may be in a range from about 10 degrees to about 20 degrees. The rear surface 422 is arranged such that light reflected by the reflection layer 41 leaves each of protrusions 42 through the corresponding rear surface 422. The rear surface 422 may directly face the reticle 21 (or reticle stage 22) and be located closer to the reticle 21 (or reticle stage 22) than the bouncing surface 421.

Figure 6:
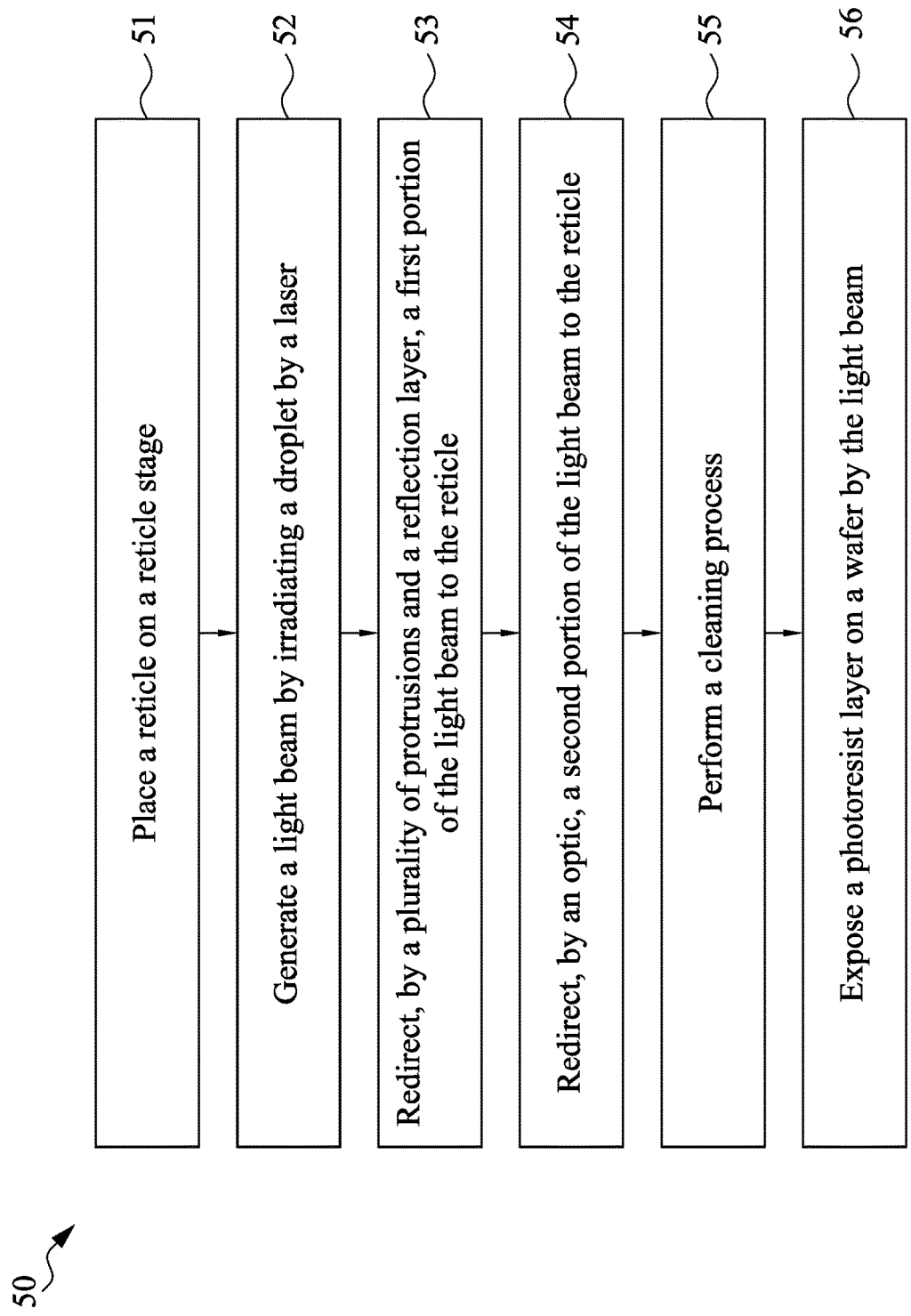
FIG. 6 is a flowchart of a method for a lithography exposure process according to some embodiments of the present disclosure.

FIG. 6 shows a method 50 for a lithography exposure process according to some embodiments of the present disclosure. For illustration, the flow chart of FIG. 6 will be described along with the schematic views shown in FIGS. 7-9. The illustration is merely exemplary and is not intended to limit beyond what is specifically recited in the claims that follow. It is understood that additional operations may be provided before, during, and after the steps shown by FIG. 6, and some of the steps described below can be replaced or eliminated in additional embodiments of the method. The order of the operations/processes may be interchangeable.

Figure 7:
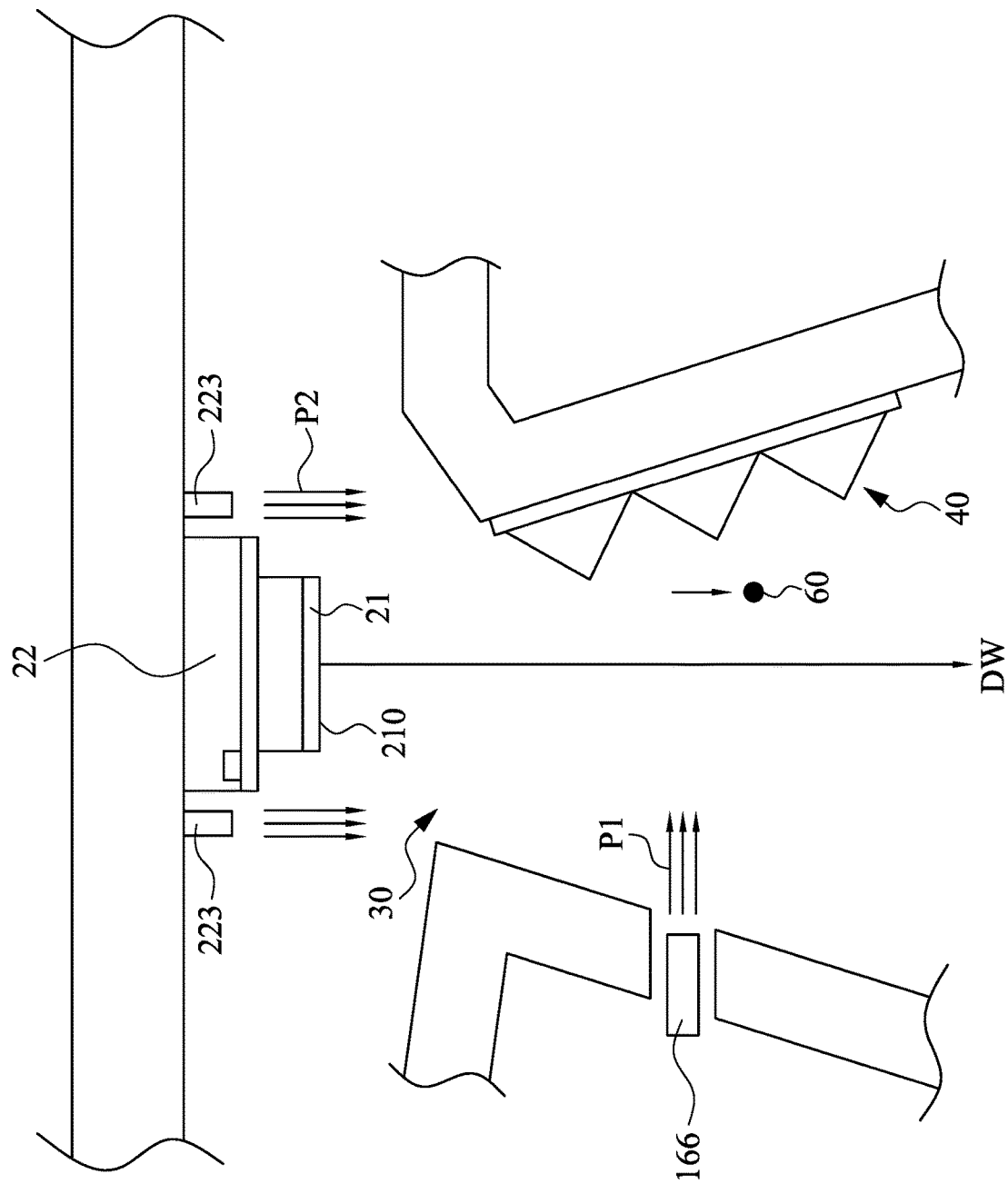
FIG. 7 is a schematic view of one stage of a method for a lithography exposure process according to some embodiments of the present disclosure, wherein a purging gas is discharged toward an intermediate passage and a reticle is placed on a reticle stage.

The method 50 includes operation 51, in which the reticle 21 is placed on the reticle stage 22. In some embodiments, the reticle 21 is placed on the reticle stage 22 by a robotic arm (not shown in figures). After the reticle 21 is loaded on the reticle stage 22, a front surface 210 faces in a downward directions DW, as shown in FIG. 7. In the embodiment of FIG. 7, the downward directions DW is perpendicular to the reticle stage 22 and passes through the intermediate passage 30.

Figure 8:
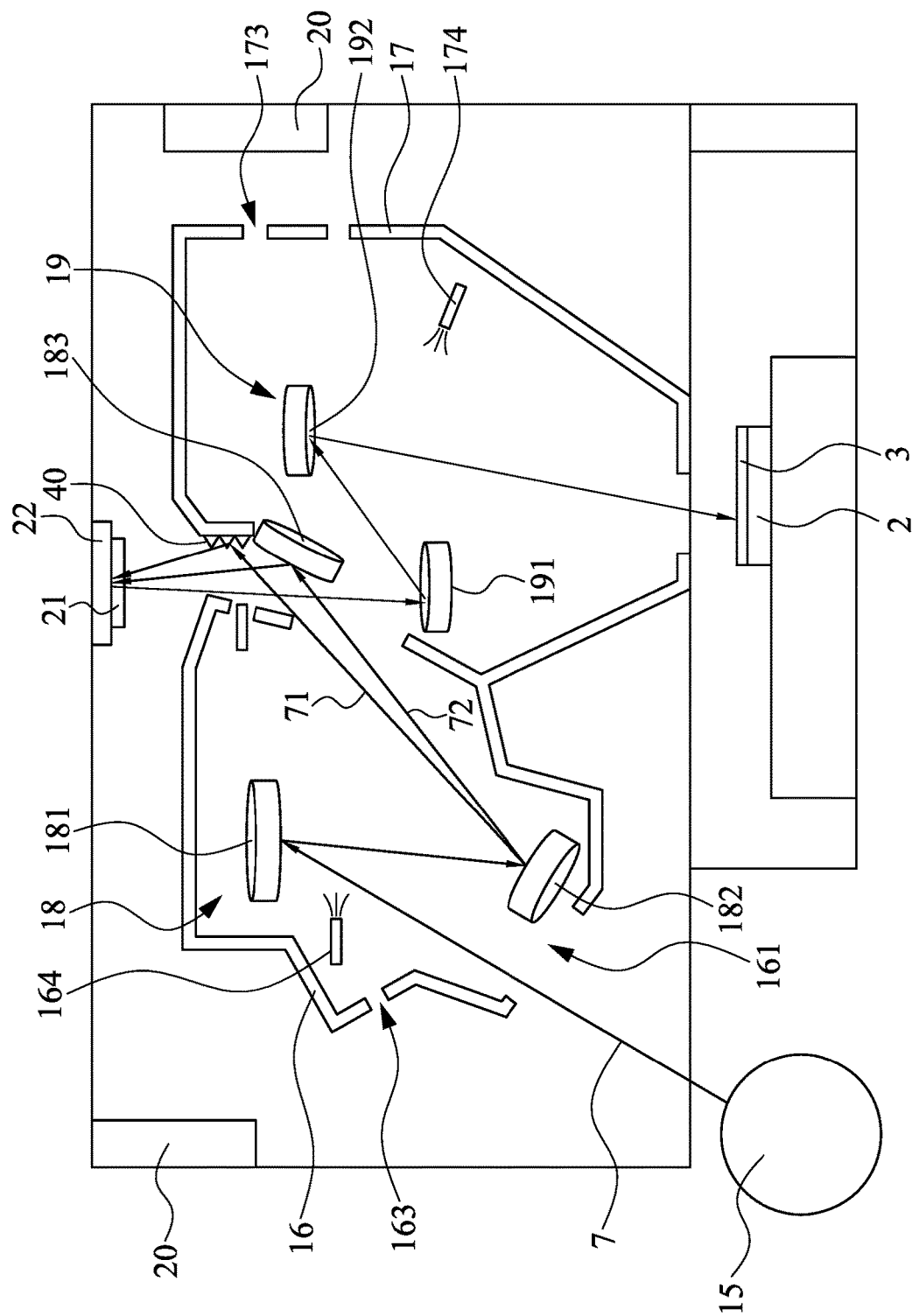
FIG. 8 is a schematic view of one stage of a method for a lithography exposure process according to some embodiments of the present disclosure, wherein a light beam is transmitted from a light source to a wafer.

The method 50 also includes operation 52, in which a light beam, such as EUV light beam, is generated from the EUV light source 15 by irradiating droplets DP by lasers LR1 and LR2 (as shown in FIG. 2). In some embodiments, as shown in FIG. 8, the light beam 7 from the EUV light source 15 is guided to pass through the first inner chamber 16 before its reaching on the reticle 21.

Specifically, the light beam 7 enters the first inner chamber 16 through the light entry passage 161 and then is reflected by the optics 181 and 182. In some embodiments, the optic 182 includes a number of small mirrors. The incoming light beam on the optic 182 is broken to many small light beams by the optic 182. For the purpose of illustration, two portions (such as first portion of the light beam 71 and second portion of the light beam 72) of the light beam are schematically displayed in FIG. 8. The first portion of the light beam 71 and the second portion of the light beam 72 leave the first inner chamber 16 through the light emitting passage 162 and enter the intermediate passage 30. Afterwards, the first portion of the light beam 71 impinges on the particle blocker 40, and the second portion of the light beam 72 impinges on the optic 183.

Figure 9:
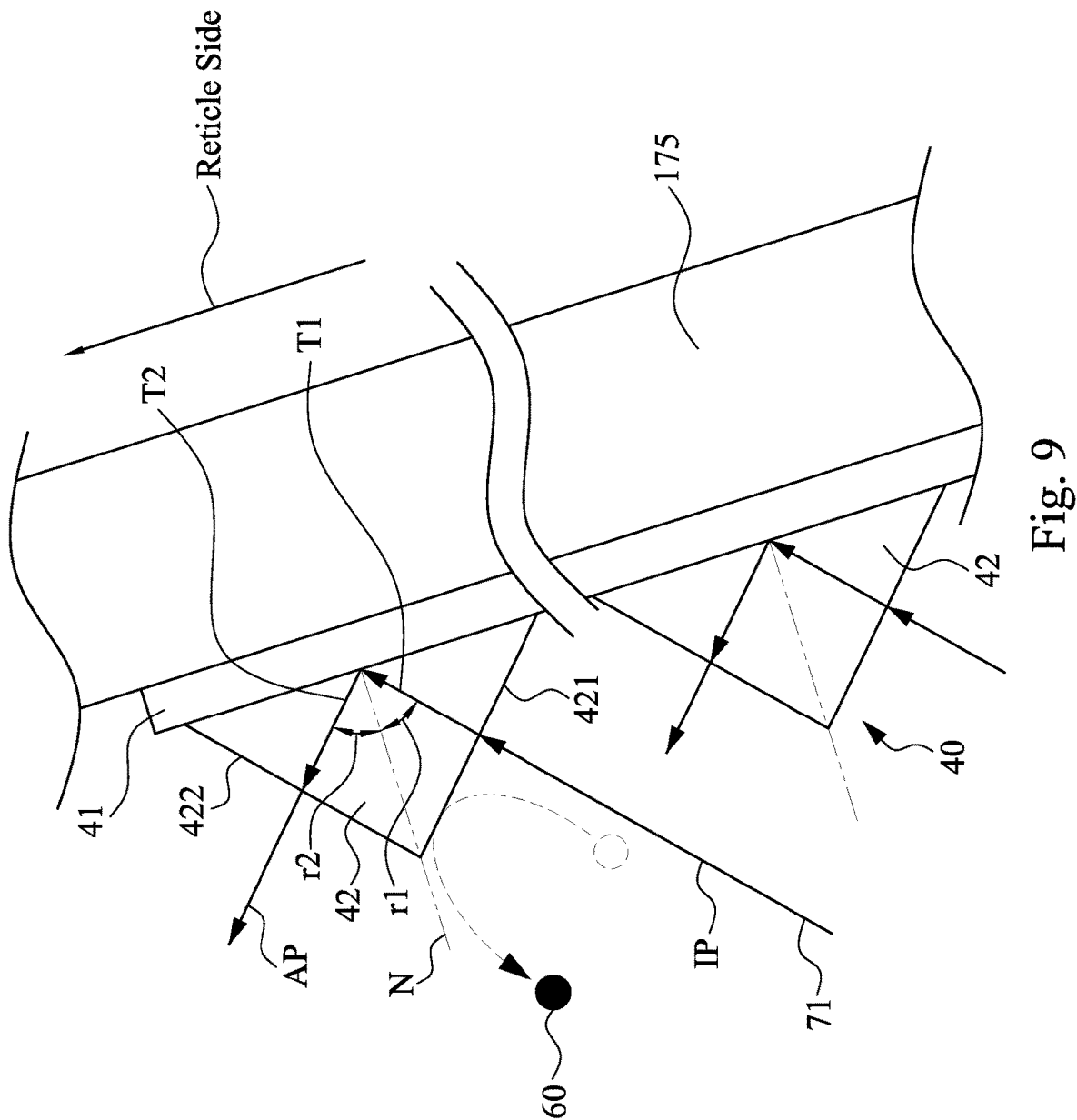
FIG. 9 is a schematic view of one stage of a method for a lithography exposure process according to some embodiments of the present disclosure, wherein a light beam is directed by protrusions and a reflection layer.

The method 50 also includes operation 53, in which the first portion of the light beam 71 is directed by the protrusions 42 and the reflection layer 41 to the reticle 21. In some embodiments, as shown in FIG. 9, the first portion of the light beam 71 is transmitted along an intermediate traveling path IP and is incident into each of the protrusions 42 through the corresponding bouncing surface 421. Then, the first portion of the light beam 71 is transmitted in each of the protrusions 42 along a first internal traveling path T1 and impinges on the reflection layer 41.

In some embodiments, an angle of incident of the first portion of the light beam 71 on the bouncing surface 421 is about 0 degree. Therefore, no refraction occurs as the first portion of the light beam 71 passes across the bouncing surface 421, and the first internal traveling path T1 continues at the end of the intermediate traveling path IP. However, it should be appreciated that many variations and modifications can be made to the embodiments of the disclosure. In some other embodiments, a light refraction occurs when the first portion of the light beam 71 passes across the bouncing surface 421, and the first internal traveling path T1 forms an included angle that is not equal to 180 degrees with the intermediate traveling path IP.

After the first portion of the light beam 71 passes across the bouncing surface 421, the first portion of the light beam 71 is projected on the reflection layer 41 and is reflected by the reflection layer 41. Afterwards, the first portion of the light beam 71 is transmitted in each of the protrusions 42 along a second internal traveling path T2 and then leaves the protrusions 42 through the rear surface 422. The first portion of the light beam 71 is transmitted to the reticle 21 (as shown in FIG. 9) along an advanced traveling path AP after its leaving from the rear surface 422. The advanced traveling path AP is a straight line.

In some embodiments, an angle of incident of the first portion of the light beam 71 on the rear surface 422 is about 0 degree. Therefore, no refraction occurs as the first portion of the light beam 71 passes across the rear surface 422, and the advanced traveling path AP continues at the end of the second internal traveling path T2. However, it should be appreciated that many variations and modifications can be made to the embodiments of the disclosure. In some other embodiments, a light refraction occurs when the first portion of the light beam 71 passes across the rear surface 422, and the second internal traveling path T2 forms an included angle that is not equal to 180 degrees with the advanced traveling path AP.

In some embodiments, the intermediate traveling path IP forms an included angle r1 with respected to a normal line N of the reflection layer 41. In addition, the advanced traveling path AP forms an included angle r2 with respected to the normal line N of the reflection layer 41. The included angle r1 is equal to the included angle r2. That is, the traveling path of the first portion of the light beam 71 is not changed even though the protrusions 42 are formed on the reflection layer 41.

In some embodiments, as shown in FIG. 9, a portion of debris 60 in the intermediate passage 30 (e.g., 25% reduction of Sn particles that contaminate the reticle 21) is blocked from moving toward the reticle 21 by the particle blocker 40. The debris 60 in the intermediate passage 30 may come from the EUV light source 15. Alternatively, the debris 60 in the intermediate passage 30 may be a semi-volatile solid produced due to a chemical reaction of the light beam 7 with gases in the intermediate passage 30. However, due to the arrangements of the protrusions 42 that each of the bouncing surfaces 421 faces in a direction that forms an acute angle with the downward direction DW, a portion of debris 60 moving in a direction that is opposite to the downward direction DW collapses with the bouncing surfaces 421 and bounces back to move in the downward direction DW or other directions away from the reticle 21. As a result, the concern that the reticle 21 may be contaminated by the debris 60 from the intermediate passage 30 is mitigated.

The method 50 also includes operation 54, in which the second portion of the light beam 72 is directed by the optic 183 to the reticle 21. In some embodiments, as shown in FIG. 8, the first portion of light beam 71 converges with the second portion of light beam 72 at the front surface 210 of the reticle 21, and the reticle 21 reflected pattern images (dotted line shown in FIG. 8) into the second inner chamber 17. In some embodiments, the light beam 7 reflected by the reticle 21 is guided to pass through the second inner chamber 17 before its reaching on the wafer 2. Specifically, the light beam 7 enters the second inner chamber 17 through the light entry passage 171 and impinges on the optic 191. Afterwards, the light beam 7 is reflected and focused by the optic 191 and the optic 192 and leaves the second inner chamber 17 through the light emitting passage 172.

The method 50 also includes operation 55, in which a cleaning process is performed to clean the particle blocker 40 by discharging purging gas over the particle blocker 40. In some embodiments, with the increasing time duration in use of the particle blocker 40, the amount of the first portion of the light beam 71 directing by the particle blocker 40 to the reticle 21 may be reduced because of stuck-on debris 60 on the bouncing surface 421. To clean the particle blocker 40, the cleaning process is performed. In the cleaning process, as shown in FIG. 7, a purging gas P1 from the gas nozzle 166 may be discharged to the particle blocker 40 to force the debris 60 detaching from the bouncing surface 421. The purging gas P1 is supplied in a direction that is perpendicular to the downward direction DW.

Additionally or alternatively, the purging gas P2 may be discharged by the gas nozzles 223 in the cleaning process. The purging gas P2 is supplied in a direction that is substantially parallel with the downward direction DW and discharged over the particle blocker 40 to remove the stuck-on debris 60. In cases where the purging gas P1 and the purging gas P2 are supplied simultaneously, the debris 60 on the bouncing surface 421 is firstly removed by the purging gas P1 and is forced to move in a direction away from the reticle 21 by the purging gas P2. The purging gas P1 and the purging gas P2 may be continuously or intermittently supplied before, during and/or after the loading of the reticle 21 on the reticle stage 22.

In some embodiments, in addition to the purging gas supplied from the gas nozzles 166 and 223, the gas inlets 164 and 174 located in the first and second inner chambers 16 and 17 are used to supply purging gas P2 into the first and second inner chambers 16 and 17, as shown in FIG. 7. Additionally, with the operation of the pumping module 20, the gas supplied from the gas nozzles 166 and 223 and the gas inlets 164 and 174 are evacuated from the first and second inner chambers 16 and 17 through the orifices 163 and 173.

In some embodiments, the debris 60 collected in the cleaning process moves into the first and second inner chambers 16 and 17 and is evacuated from the first and second inner chambers 16 and 17 through the orifices 163 and 173. As a result, the intermediate passage 30 and the first and second inner chambers 16 and 17 are kept clean during the lithography exposure process, so a cycle time to perform a prevention maintenance (PM) operation to the lithography system 10 can be prolonged, and a throughput of the lithography system 10 is increased.

The method 50 also includes operation 56, in which the photoresist layer 3 on the wafer 2 is exposed to the light beam 7. The method 50 may include other operations to complete the lithography process. For example, the method 50 may include an operation by developing the exposed resist layer to form a resist pattern having a plurality of openings defined thereon. The method 100 may further include other operations, such as an operation to perform a fabrication process on the wafer 2 through the openings of the resist pattern. In one example, the fabrication process includes an etch process on the wafer 2 using the resist pattern as an etch mask. In another example, the fabrication process includes an ion implantation process on the wafer 2 using the resist pattern as an implantation mask.

Although not intended to be limiting, one or more embodiments of the present disclosure provide many benefits to the manufacturing of semiconductor devices. For example, embodiments of the present disclosure provide apparatus and methods for effectively reducing contamination on reticle, thereby extending its usable lifetime and reducing risk of reticle scrapping. In addition, the apparatus and methods provided herein enable an accurate pattern (i.e., minimizing critical dimension drift and overlap drift) transfer from the reticle to the wafer because issue of particle attaching to the front side of the reticle is effectively prevented. Moreover, the apparatus and methods provided herein enable in-line maintenance of the lithography system, thereby reducing the downtime of the lithography system and increasing the throughput thereof. Embodiments of the present disclosure can be implemented or integrated into existing EUV lithography systems.

According to some embodiments of the present disclosure, a method for a lithography exposing process includes placing a reticle over a reticle stage, generating a light beam by irradiating a droplet by a laser, projecting a first portion of the light beam over a plurality of light permeable protrusions formed on a reflection layer and directing, by the protrusions and the reflection layer, the first portion of the light beam to the reticle.

According to some embodiments of the present disclosure, a method for a lithography exposing process includes orienting a reticle with a front surface facing in a downward direction, generating a light beam by irradiating a droplet by a laser, and directing, by a plurality of optics, the light beam to the reticle. A portion of the light beam is projected on a plurality of protrusions that are located adjacent to one of the optics that located below the reticle. The portion of the light beam is incident into the protrusions through a bouncing surface of each of the protrusions, and each of the bouncing surface faces in a direction that forms an acute angle with the downward direction.

According to some embodiments of the present disclosure, a lithography system includes a light source, a reticle stage, a reflection layer and a number of light permeable protrusions. The light source is configured for generating a light beam. The reticle stage is configured for holding a reticle with a front surface of the reticle facing in a downward direction. The protrusions are formed on the reflection layer and each of the protrusions includes a bouncing surface facing in a direction that forms an acute angle with the downward direction. A first portion of the light beam from the light source impinges on the bouncing surface and is directed to the reticle by the protrusions and the reflection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for a lithography exposing process, comprising:
    placing a reticle over a reticle stage;
    generating a light beam by irradiating a droplet by a laser;
    directing, by one or more optics, a first portion of the light beam to a plurality of light permeable protrusions formed on a reflection layer, wherein the light permeable protrusions are made of $SiO_2$, and the reflection layer comprises a material different from $SiO_2$; and
    directing, by the light permeable protrusions and the reflection layer, the first portion of the light beam to the reticle.

2. The method of claim 1, wherein the first portion of the light beam is incident into the light permeable protrusions through a bouncing surface of each of the light permeable protrusions, and the first portion of the light beam passes through the bouncing surface of each of the light permeable protrusions at an incident angle of about 0 degree.

3. The method as claimed in claim 1, wherein a front surface of the reticle faces in a downward direction, the first portion of the light beam is incident into the light permeable protrusions through a bouncing surface of each of the light permeable protrusions;
    wherein the bouncing surface of each of the light permeable protrusions faces in a direction that forms an acute angle with the downward direction.

4. The method as claimed in claim 1, wherein the first portion of the light beam reflected by the reflection layer passes through a rear surface of each of the light permeable protrusions and then leaves the light permeable protrusions;
    wherein the first portion of the light beam passes through the rear surfaces of each of the light permeable protrusions at an incident angle of about 0 degree.

5. The method as claimed in claim 1, further comprising directing a second portion of the light beam to a reflective optic located adjacent to the reflection layer; and
   directing, by the reflective optic, the second portion of the light beam to the reticle.

6. The method as claimed in claim 1, wherein the first portion of the light beam is directed to the light permeable protrusions along a first traveling path and is directed to the reticle along a second traveling path;
   wherein the first traveling path and the second traveling path form the same angle with respect to a normal line of the reflection layer.

7. The method as claimed in claim 6, wherein the second traveling path is a straight line passing through the reticle.

8. The method as claimed in claim 1, further comprising:
   blowing the light permeable protrusions using a purging gas.

9. A method for a lithography exposing process, comprising:
   orienting a reticle such that a front surface of the reticle facing in a downward direction;
   generating a light beam by irradiating a droplet by laser of a lithography system, wherein the lithography system comprises a first inner chamber and a second inner chamber;
   directing, by a plurality of first optics in the first inner chamber, the light beam to the reticle, wherein a portion of the light beam is projected on a plurality of protrusions that are located on an outer sidewall of the second inner chamber positioned below the reticle, wherein the portion of the light beam is incident into the protrusions through a bouncing surface of each of the protrusions, and the bouncing surface of each of the protrusions faces in a direction that forms an acute angle with the downward direction; and
   directing, by a plurality of second optics in the second inner chamber, the portion of the light beam from the reticle to a wafer.

10. The method as claimed in claim 9, wherein the portion of the light beam is incident into the protrusions through a bouncing surface of each of the protrusions, and the portion of the light beam passes through the bouncing surface of each of the protrusions at an incident angle of about 0 degree.

11. The method as claimed in claim 10, wherein the portion of the light beam passing through the bouncing surface of each of the protrusions is reflected to the reticle by a reflection layer on which the protrusions are disposed.

12. The method as claimed in claim 11, wherein the portion of the light beam reflected by the reflection layer passes through a rear surface of each of the protrusions and then leaves the protrusions;
   wherein the portion of the light beam passes through the rear surfaces of each of the protrusions at an incident angle of about 0 degree.

13. The method as claimed in claim 11, wherein the portion of the light beam is directed to the protrusions along a first traveling path and is directed to the reticle along a second traveling path;
   wherein the first traveling path and the second traveling path form the same angle with respect to a normal line of the reflection layer.

14. The method as claimed in claim 13, wherein the second traveling path is a straight line passing through the reticle.

15. The method as claimed in claim 9, further comprising:
   purging the protrusions using a gas.

16. A method for a lithography exposing process, comprising:
   placing a reticle over a reticle stage;
   generating a light beam by irradiating a droplet by a laser;
   directing, by one or more first optics, the light beam to a light permeable protrusion on a reflection layer, wherein the light beam is incident into the light permeable protrusion and is reflected at an interface between the light permeable protrusion and the reflection layer while a debris of the light beam is reflected by a sidewall of the light permeable protrusion;
   directing, by the light permeable protrusion and the reflection layer, the light beam to the reticle; and
   directing, by one or more second optics in an inner chamber, the light beam from the reticle, through the inner chamber, to a wafer, wherein the light permeable protrusion and the reflection layer are fixed on an outer sidewall of the inner chamber.

17. The method of claim 16, wherein the debris is spaced apart from the interface between the light permeable protrusion and the reflection layer.

18. The method of claim 16, wherein the light beam is normally incident onto the sidewall of the light permeable protrusion.

19. The method of claim 16, wherein the reticle faces downward, and the method further comprises:
   purging the light permeable protrusion laterally; and
   after purging the light permeable protrusion laterally, purging the light permeable protrusion downwardly.

20. The method of claim 16, wherein the light permeable protrusion is pyramid shaped.

* * * * *